US010466315B2

(12) United States Patent
Umetsu

(10) Patent No.: US 10,466,315 B2
(45) Date of Patent: *Nov. 5, 2019

(54) MAGNETIC DETECTION DEVICE INCLUDING A BRIDGE CIRCUIT AND MAGNETORESISTIVE ELEMENTS PROVIDED ON INCLINED SURFACES OF SUBSTRATE RECESSES

(71) Applicant: ALPS ALPINE CO., LTD., Tokyo (JP)

(72) Inventor: Eiji Umetsu, Niigata-Ken (JP)

(73) Assignee: ALPS ALPINE CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/996,199

(22) Filed: Jun. 1, 2018

(65) Prior Publication Data

US 2018/0275219 A1 Sep. 27, 2018

Related U.S. Application Data

(63) Continuation of application No. PCT/JP2016/085920, filed on Dec. 2, 2016.

(30) Foreign Application Priority Data

Dec. 3, 2015 (JP) ................. 2015-236855

(51) Int. Cl.
G11B 5/39 (2006.01)
G01R 33/09 (2006.01)
(Continued)

(52) U.S. Cl.
CPC ........... *G01R 33/093* (2013.01); *G01R 33/09* (2013.01); *G11B 5/372* (2013.01); *G11B 5/374* (2013.01);
(Continued)

(58) Field of Classification Search
CPC ........ G11B 5/372; G11B 5/374; G11B 5/3948
(Continued)

(56) References Cited

U.S. PATENT DOCUMENTS 9,069,033 B2 * 6/2015 Chen .................... G01R 33/098
9,423,474 B2 * 8/2016 Paci .................... G01R 33/0017
(Continued)

FOREIGN PATENT DOCUMENTS

JP 2007-235051 9/2007
JP 2009-20092 1/2009
(Continued)

OTHER PUBLICATIONS

International Search Report for corresponding International Patent Application No. PCT/JP2016/085920, dated Jan. 31, 2017, 3 pages.
(Continued)

*Primary Examiner* — Jefferson A Evans
(74) *Attorney, Agent, or Firm* — Brinks Gilson & Lione

(57) ABSTRACT

A magnetic field detection device includes a Z-direction detection unit with magnetoresistive elements provided on inclined side surfaces of Z-direction detection recesses; an X-direction detection unit includes magnetoresistive elements provided on inclined side surfaces of X-direction detection recesses and a Y-detection unit includes magnetoresistive elements provided on inclined side surfaces of Y-direction detection recesses, each of the detection units having a bridge circuit comprising two element lines connected in parallel, each element line comprising two of the magnetoresistive elements connected in series.

9 Claims, 11 Drawing Sheets

(51) Int. Cl.
*H01L 43/08* (2006.01)
*G11B 5/37* (2006.01)
*H01L 43/12* (2006.01)
*B82Y 25/00* (2011.01)

(52) U.S. Cl.
CPC .......... *G11B 5/3906* (2013.01); *G11B 5/3912* (2013.01); *G11B 5/3948* (2013.01); *H01L 43/08* (2013.01); *H01L 43/12* (2013.01); *B82Y 25/00* (2013.01)

(58) Field of Classification Search
USPC .................................................. 360/314, 319
See application file for complete search history.

(56) References Cited

U.S. PATENT DOCUMENTS

| | | | | |
|---|---|---|---|---|
| 9,488,702 | B2* | 11/2016 | Meguro | B82Y 25/00 |
| 9,557,392 | B2* | 1/2017 | Schuhl | G01R 33/0005 |
| 9,632,104 | B2* | 4/2017 | Benzel | G01P 3/487 |
| 9,645,204 | B2* | 5/2017 | Chen | G01R 33/0017 |
| 9,733,316 | B2* | 8/2017 | Lei | G01R 33/093 |
| 9,933,496 | B2* | 4/2018 | Holm | G01R 33/0206 |
| 10,145,907 | B2* | 12/2018 | Holm | G01R 33/09 |
| 2007/0205766 | A1 | 9/2007 | Kou | |
| 2008/0309331 | A1* | 12/2008 | Qian | B82Y 25/00 324/252 |
| 2009/0015251 | A1 | 1/2009 | Azumi et al. | |
| 2009/0027048 | A1 | 1/2009 | Sato et al. | |
| 2010/0327864 | A1* | 12/2010 | Vigna | B82Y 25/00 324/252 |
| 2011/0089941 | A1 | 4/2011 | Sasaki | |
| 2012/0068698 | A1* | 3/2012 | Chen | G01R 33/098 324/252 |
| 2013/0134970 | A1 | 5/2013 | Schuhl | |
| 2013/0241545 | A1* | 9/2013 | Obana | G01R 33/093 324/252 |
| 2014/0266187 | A1 | 9/2014 | Mather | |
| 2015/0285873 | A1 | 10/2015 | Cai et al. | |
| 2017/0123016 | A1* | 5/2017 | Deak | G01R 33/04 |

FOREIGN PATENT DOCUMENTS

| | | |
|---|---|---|
| JP | 2013-518273 | 5/2013 |
| JP | 2015-175620 | 10/2015 |
| JP | 2015-532429 | 11/2015 |
| JP | 2016-072554 | 5/2016 |
| JP | 2016-072555 | 5/2016 |
| WO | WO 2010/010872 A1 | 1/2010 |

OTHER PUBLICATIONS

Notification of Reason for Refusal received in corresponding Japanese application No. 2017-554204, 4 pages, dated Dec. 30, 2018.
Notification of Reason for Refusal received in corresponding Japanese application No. 2017-554203, 10 pages, dated Jan. 31, 2019.

* cited by examiner

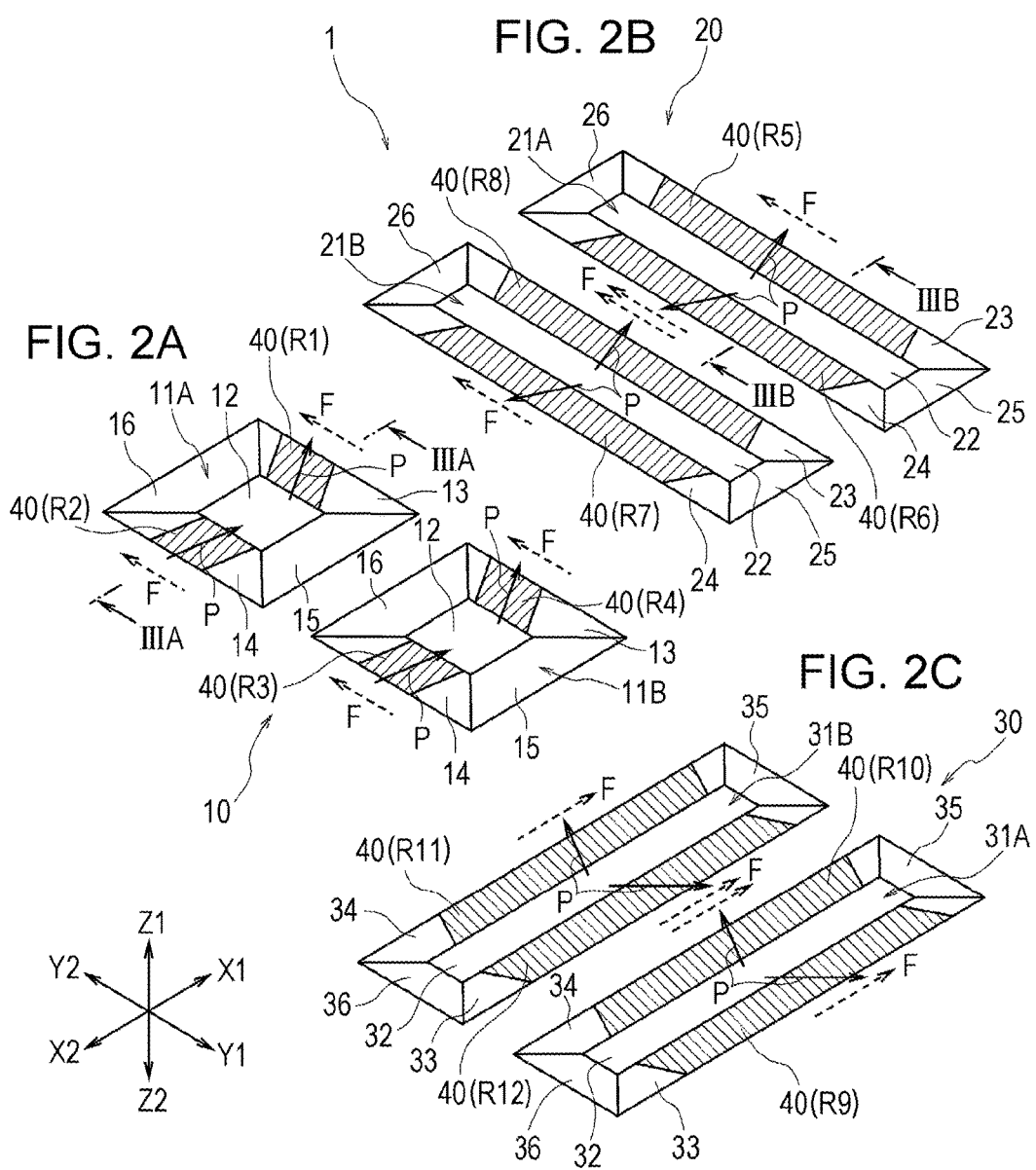

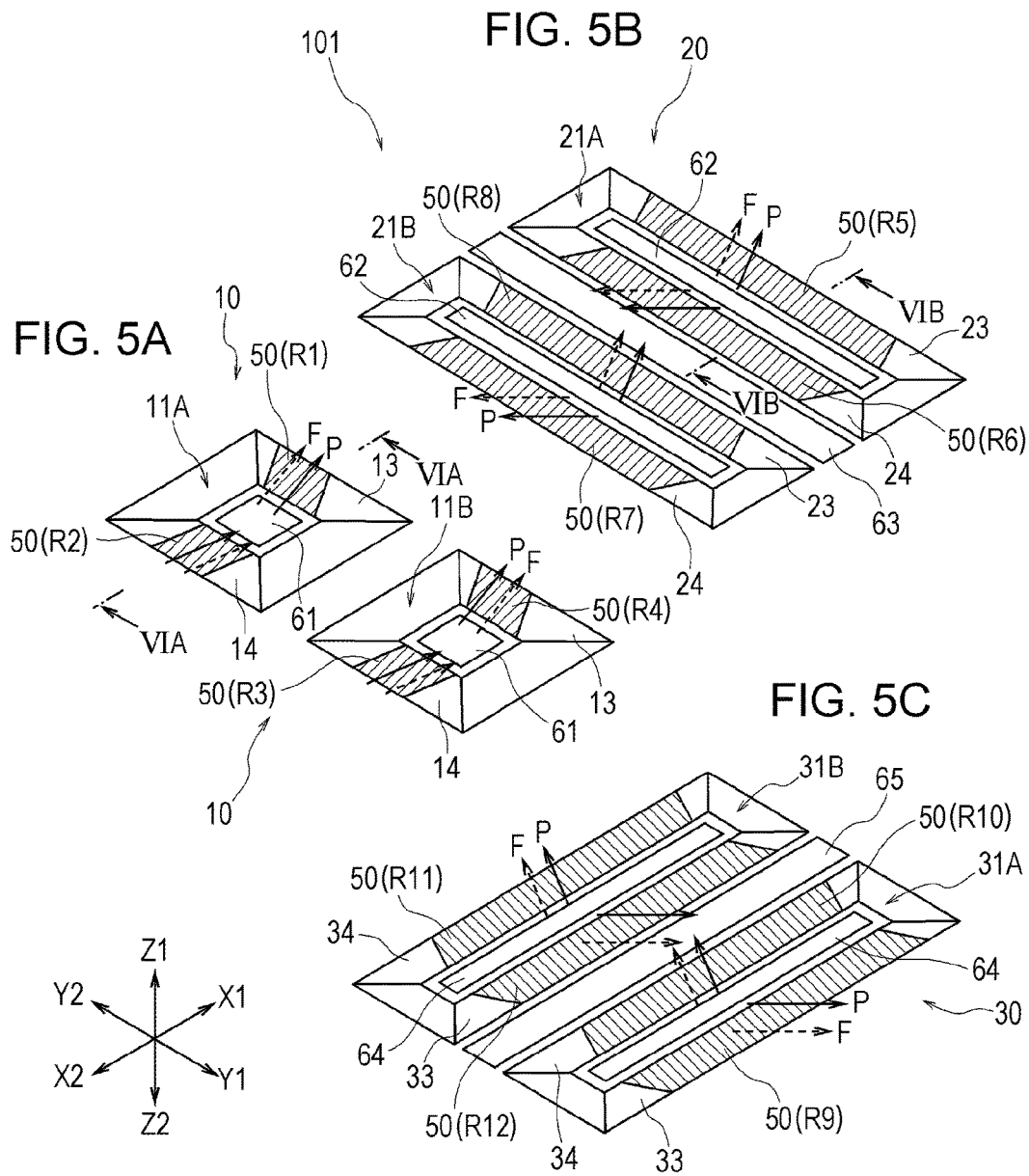

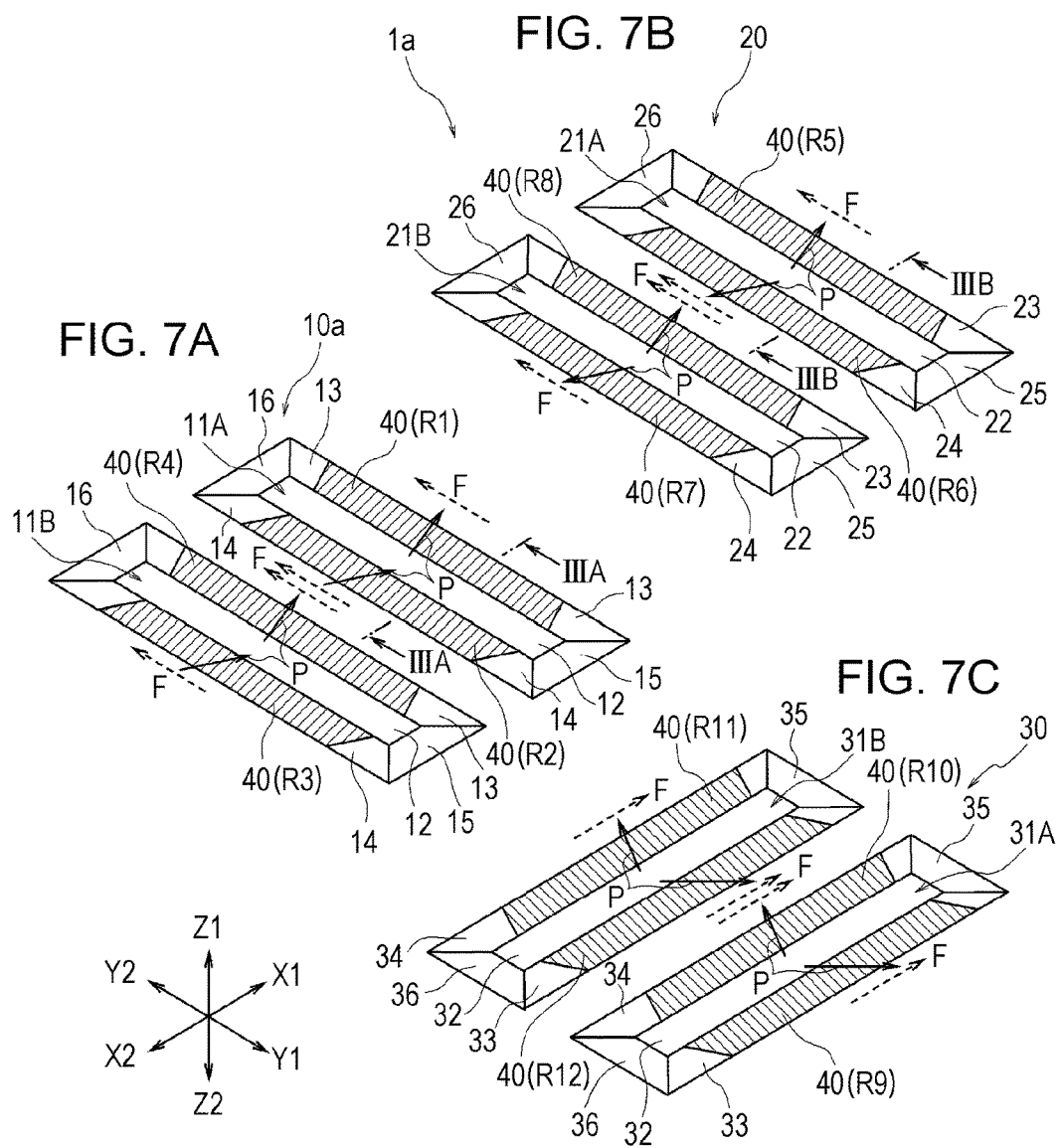

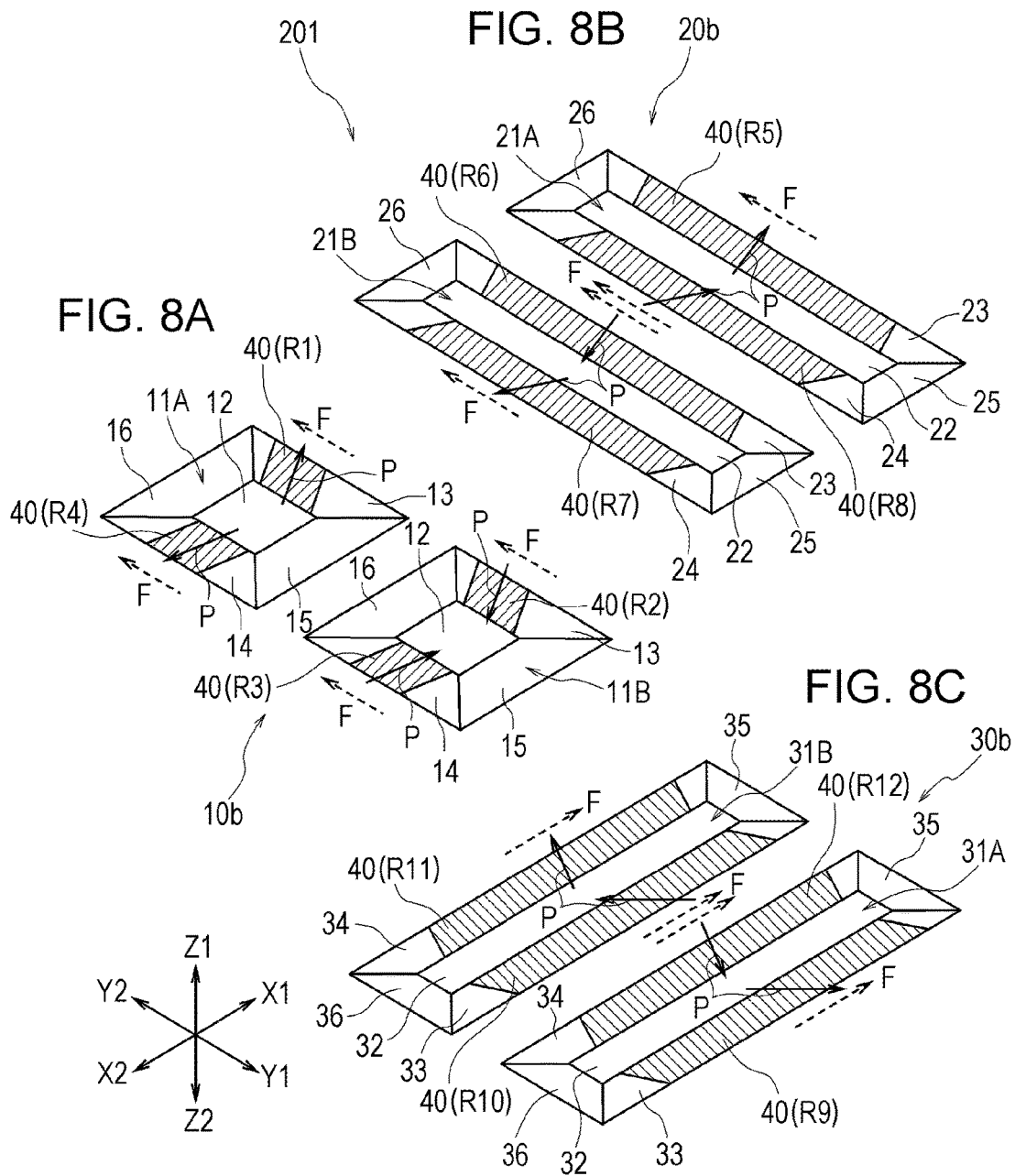

MAGNETIC DETECTION DEVICE INCLUDING A BRIDGE CIRCUIT AND MAGNETORESISTIVE ELEMENTS PROVIDED ON INCLINED SURFACES OF SUBSTRATE RECESSES

CLAIM OF PRIORITY

This application is a Continuation of International Application No. PCT/JP2016/085920 filed on Dec. 2, 2016, which claims benefit of Japanese Patent Application No. 2015-236855 filed on Dec. 3, 2015. The entire contents of each application noted above are hereby incorporated by reference.

BACKGROUND

1. Field of the Disclosure

The present disclosure relates to a magnetic detection device including magnetoresistive elements disposed on inclined side surfaces of recesses formed in a substrate.

2. Description of the Related Art

Japanese Unexamined Patent Application Publication No. 2009-20092 (hereinafter referred to as Patent Document 1) describes an invention relating to a magnetic sensor including a substrate having grooves and detection units formed on inclined surfaces of the grooves.

In this magnetic sensor, a silicon wafer having a (100) crystal plane is etched to form grooves having inclined side surfaces along (111) crystal planes. A pair of detection units are formed on the same inclined surface of one of the grooves, and fixed resistors are formed on other inclined surfaces. The detection units and the fixed resistors form a bridge circuit. Each detection unit is formed so that the direction of magnetic sensitivity is the depth direction of the inclined surface.

Japanese Unexamined Patent Application Publication No. 2007-235051 (hereinafter referred to as Patent Document 2) describes magnetoresistive elements, such as TMR or GMR elements, formed on inclined surfaces of a recess formed by etching a silicon substrate.

Each magnetoresistive element includes a PIN layer and a soft layer. After the magnetoresistive element is formed on the silicon substrate, annealing is performed while a magnetic field is applied in a direction perpendicular to a substrate surface of the silicon substrate, so that the magnetization direction of the PIN layer is oriented in a depth direction of the recess.

In the magnetic sensor described in Patent Document 1, the pair of detection units are formed on the same inclined surface of one of the grooves in the substrate. Accordingly, the pair of detection units have the same sensitivity polarity with respect to an external magnetic field, and therefore each detection unit needs to be connected to a corresponding one of the fixed resistors in series to form the bridge circuit. Since the fixed resistors do not react to an external magnetic field, a magnetic detection output from the bridge circuit has a limited sensitivity.

According to Patent Document 2, the magnetoresistive elements formed on opposing inclined surfaces are annealed while a magnetic field is applied in a direction perpendicular to the substrate surface of the silicon substrate, so that the PIN layers included in the magnetoresistive elements are magnetized upward in the depth direction of the inclined surfaces. Accordingly, the magnetoresistive elements formed on the opposing inclined surfaces have resistances of opposite polarities.

However, the disclosure of Patent Document 2 only describes how to produce the magnetoresistive elements, and does not refer to a detection circuit formed by using the magnetoresistive elements.

In addition, according to Patent Document 2, the magnetoresistive elements are annealed in a magnetic field directed upward with respect to the substrate surface of the silicon substrate to fix the magnetization direction of the PIN layers. Therefore, the PIN layers of all of the magnetoresistive elements are magnetized so that the magnetization direction thereof is fixed to an upward direction, and only a limited type of magnetoresistive elements can be formed.

SUMMARY

A magnetic detection device includes a substrate having recesses and magnetoresistive elements provided on inclined side surfaces of the recesses. Z detection recesses are disposed at least at two locations, each Z detection recess include a first inclined side surface and a second inclined side surface opposing each other with a distance therebetween gradually increasing toward a substrate surface, the first inclined side surface and the second inclined side surface have the magnetoresistive elements provided thereon. The elements each include a fixed magnetic layer, a free magnetic layer, and a nonmagnetic intermediate layer formed between the fixed magnetic layer and the free magnetic layer, and a direction of fixed magnetization of the fixed magnetic layer of each magnetoresistive element is oriented along a corresponding one of the inclined side surfaces obliquely to a thickness direction of the substrate. A bridge circuit is formed by connecting two element lines in parallel, each element line being formed by connecting in series two of the magnetoresistive elements having the directions of fixed magnetization oriented toward opposite sides in the thickness direction of the substrate. The bridge circuit detects a magnetic field in a Z direction, the Z direction being the thickness direction of the substrate.

In the above described magnetic detection device, in each of the Z detection recesses, the direction of fixed magnetization of the magnetoresistive element provided on the first inclined side surface and the direction of fixed magnetization of the magnetoresistive element provided on the second inclined side surface may be oriented toward the opposite sides in the thickness direction of the substrate.

Alternatively, the Z detection recesses may include a Z detection recess in which the directions of fixed magnetization of the magnetoresistive elements provided on the first inclined side surface and the second inclined side surface are both oriented downward in the thickness direction of the substrate and a Z detection recess in which the directions of fixed magnetization of the magnetoresistive elements provided on the first inclined side surface and the second inclined side surface are both oriented upward in the thickness direction of the substrate. The magnetoresistive elements provided on the first inclined side surfaces of different ones of the Z detection recesses and having the directions of fixed magnetization oriented toward the opposite sides are connected in series to form a first element line. The magnetoresistive elements provided on the second inclined side surfaces of different ones of the Z detection recesses and having the directions of fixed magnetization oriented toward the opposite sides are connected in series to form a second element line. The first element line and the second element line are connected in parallel to form the bridge circuit.

BRIEF DESCRIPTION OF THE DRAWINGS

FIG. 2A illustrates a Z detection unit according to a first embodiment included in the magnetic detection device illustrated in FIG. 1, FIG. 2B illustrates an X detection unit according to the first embodiment, and FIG. 2C illustrates a Y detection unit according to the first embodiment;

FIG. 5A illustrates a Z detection unit according to a second embodiment of the present invention, FIG. 5B illustrates an X detection unit according to the second embodiment, and FIG. 5C illustrates a Y detection unit according to the second embodiment;

FIG. 7A illustrates a Z detection unit according to a modification of the first embodiment included in the magnetic detection device illustrated in FIG. 1, FIG. 7B illustrates the X detection unit according to the first embodiment, and FIG. 7C illustrates the Y detection unit according to the first embodiment;

FIG. 8A illustrates a Z detection unit according to a third embodiment of the present invention, FIG. 8B illustrates an X detection unit according to the third embodiment, and FIG. 8C illustrates a Y detection unit according to the third embodiment;

DESCRIPTION OF THE EXEMPLARY EMBODIMENTS

Figure 1:
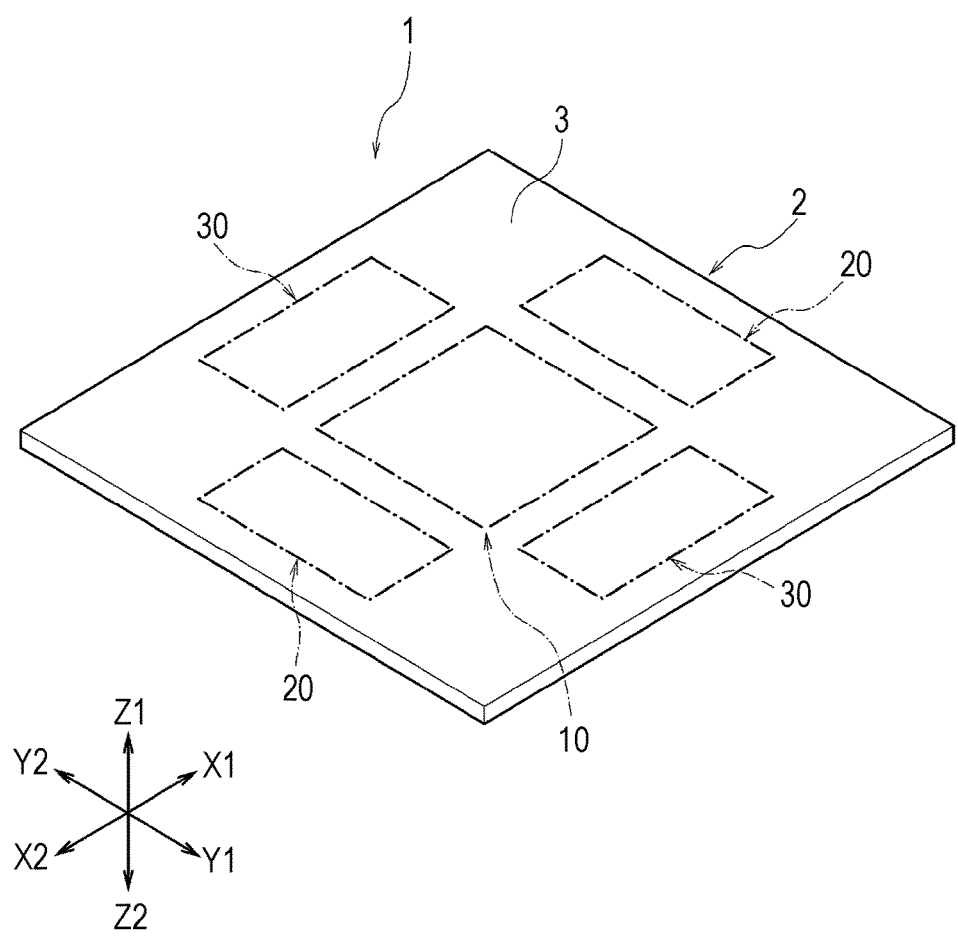
FIG. 1 is a perspective view illustrating the overall structure of a magnetic detection device according to embodiments of the present invention.

FIG. 1 illustrates a magnetic detection device 1 according to embodiments of the present invention.

The magnetic detection device 1 includes a substrate 2. A Z detection unit 10, X detection units 20, and Y detection units 30 are provided on a mounting surface (substrate surface) 3 of the substrate 2.

The Z detection unit 10 detects a magnetic field in a Z direction that is perpendicular to the mounting surface 3 of the substrate 2. Referring to FIG. 2A, which illustrates a first embodiment, the Z detection unit 10 includes at least two Z detection recesses 11A and 11B. Each X detection unit 20 detect a magnetic field in an X direction that is parallel to the mounting surface 3 of the substrate 2. As illustrated in FIG. 2B, each X detection unit 20 includes at least two X detection recesses 21A and 21B. Each Y detection unit 30 detects a magnetic field in a Y direction that is parallel to the mounting surface 3 of the substrate 2. As illustrated in FIG. 2C, each Y detection unit 30 includes at least two Y detection recesses 31A and 31B.

The X detection unit 20 and the Y detection unit 30 serve as horizontal detection units that detect magnetic fields in directions parallel to the mounting surface 3, and the X detection recesses 21A and 21B and the Y detection recesses 31A and 31B serve as horizontal detection recesses.

As illustrated in FIG. 2A, the Z detection recesses 11A and 11B each include a bottom surface 12, a first inclined side surface 13 at an X1 side, a second inclined side surface 14 at an X2 side, and inclined side surfaces 15 and 16 that oppose each other in the Y direction. The first inclined side surface 13 and the second inclined side surface 14 oppose each other in the X direction, and the distance therebetween is smallest on the bottom surface 12 and gradually increases toward the mounting surface 3.

Figure 3A:
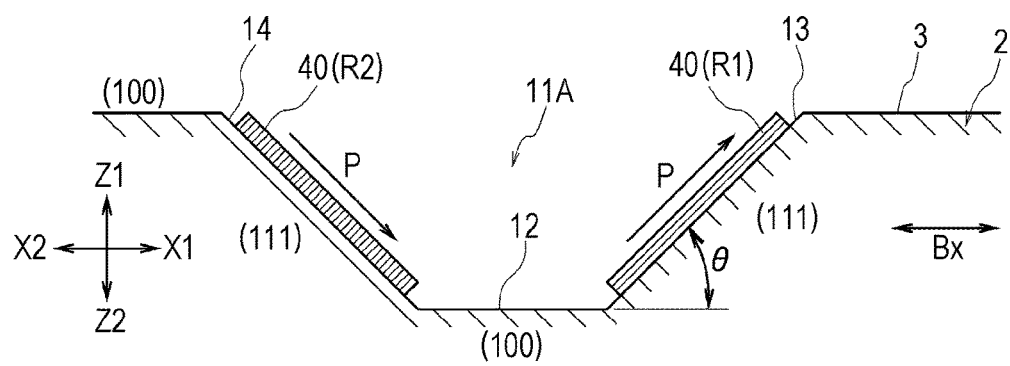
FIG. 3A is a sectional view of the Z detection unit illustrated in FIG. 2A taken along line IIIA-IIIA.
Figure 11A:
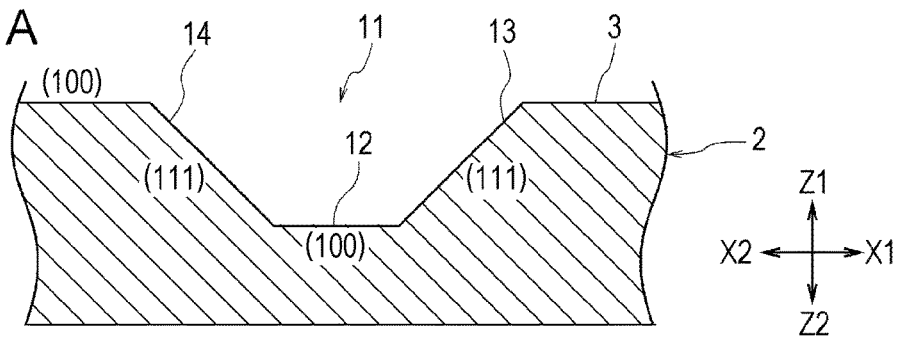
FIGS. 11A, 11B, and 11O are enlarged sectional views of a recess formed in a substrate by different processes.

Referring to FIGS. 3A and 11A, the substrate 2 that is used is a silicon (Si) substrate, and the mounting surface 3 thereof has a (100) plane orientation. Recesses which each have the first inclined side surface 13, the second inclined side surface 14, and two other inclined side surfaces 15 and 16 along (111) planes are formed by anisotropically etching the mounting surface 3 of the substrate 2 with an etchant after covering the mounting surface 3 with a layer of silicon oxide ($SiO_2$) or the like over regions other than regions in which the Z detection recesses 11A and 11B are to be formed. The inclined side surfaces 13, 14, 15, and 16 are at an angle θ of about 55 degrees with respect to a horizontal plane.

Figure 11B:
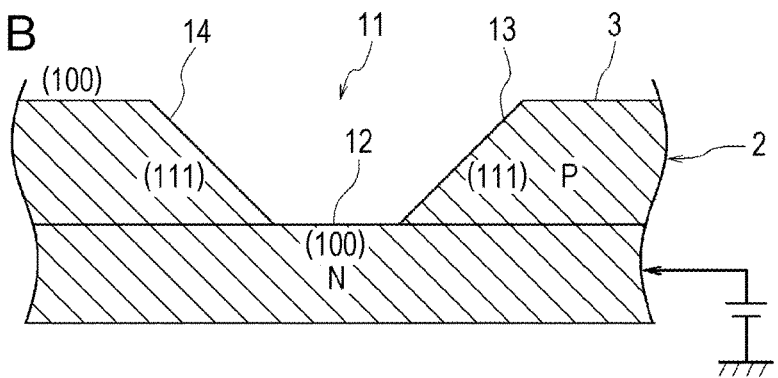
Figure 11C:
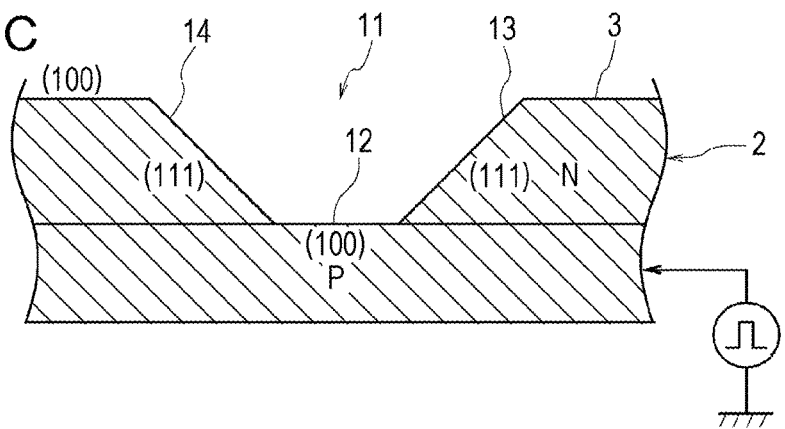

FIGS. 11B and 11C illustrate other methods for processing the substrate 2. FIG. 11B illustrates a processing method in which the substrate 2 is formed by stacking a P-type silicon substrate with a (100) plane orientation on an N-type silicon substrate with a (100) plane orientation, and is electrochemically etched. In the electrochemical etching process, a surface of the N-type silicon substrate serves as an etching stopper surface. Accordingly, the first inclined side surface 13 and the second inclined side surface 14 in each of the Z detection recesses 11A and 11B can be accurately formed to have a uniform dimension in the thickness direction (Z direction).

FIG. 11C illustrates a processing method in which the substrate 2 is formed by stacking an N-type silicon substrate with a (100) plane orientation on a P-type silicon substrate with a (100) plane orientation, and is etched by a pulsed current anodization method. In this processing method, a surface of the P-type silicon substrate serves as an etching stopper surface. Also in this case, the first inclined side surface 13 and the second inclined side surface 14 can be accurately formed to have a uniform dimension in the thickness direction (Z direction).

Figure 3B:
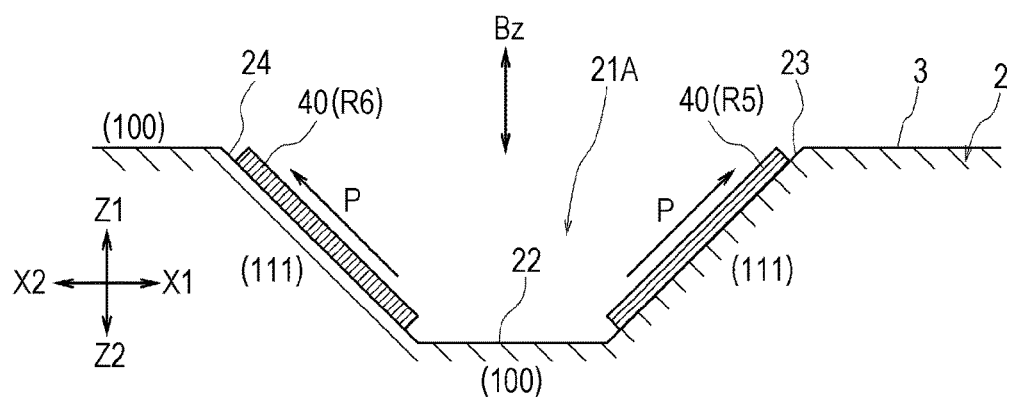
FIG. 3B is a sectional view of the X detection unit illustrated in FIG. 2B taken along line IIIB-IIIB.

As illustrated in FIG. 2B, the X detection recesses 21A and 21B, which are horizontal detection recesses, have an elongated rectangular shape with a length in the Y direction greater than a width in the X direction. As illustrated in FIG. 3B, the X detection recesses 21A and 21B each have a first inclined side surface 23 at the X1 side and a second inclined side surface 24 at the X2 side. The distance between the first inclined side surface 23 and the second inclined side surface 24 in the X direction is smallest on a bottom surface 22, and gradually increases toward the mounting surface 3. As illustrated in FIG. 2B, the X detection recesses 21A and 21B each have inclined side surfaces 25 and 26 that oppose each other in the Y direction.

The X detection recesses 21A and 21B are formed by the same method as the method for forming the Z detection recesses 11A and 11B, and any of the etching methods illustrated in FIGS. 11A, 11B, and 11C may be used.

As illustrated in FIG. 2C, the Y detection recesses 31A and 31B, which are horizontal detection recesses, have an elongated rectangular shape with a length in the X direction greater than a width in the Y direction. The Y detection recesses 31A and 31B each have a bottom surface 32, a first inclined side surface 33 at a Y1 side, and a second inclined side surface 34 at a Y2 side. The distance between the first inclined side surface 33 and the second inclined side surface 34 in the Y direction is smallest on the bottom surface 32, and gradually increases toward the mounting surface 3. The Y detection recesses 31A and 31B each have inclined side surfaces 35 and 36 that oppose each other in the X direction.

The Y detection recesses 31A and 31B are formed by the same method as the method for forming the Z detection recesses 11A and 11B, and any of the etching methods illustrated in FIGS. 11A, 11B, and 11C may be used.

As illustrated in FIGS. 2A and 3A, a first magnetoresistive element 40 (R1) is provided on the first inclined side surface 13 of the Z detection recess 11A, and a second magnetoresistive element 40 (R2) is provided on the second inclined side surface 14 of the Z detection recess 11A. A fourth magnetoresistive element 40 (R4) is provided on the first inclined side surface 13 of the Z detection recess 11B, and a third magnetoresistive element 40 (R3) is provided on the second inclined side surface 14 of the Z detection recess 11B.

Figure 4A:
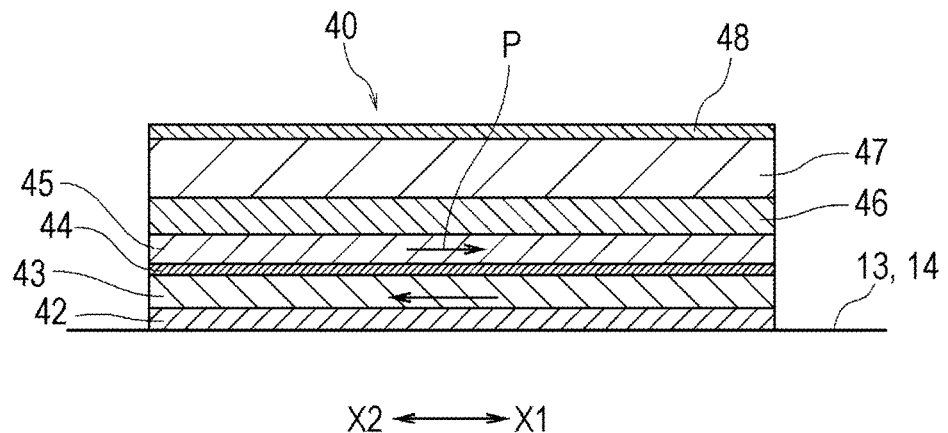
FIGS. 4A and 4B are enlarged sectional views illustrating layer structures of magnetoresistive elements included in the magnetic detection device illustrated in FIGS. 2A to 2C and FIGS. 3A and 3B.
Figure 4B:
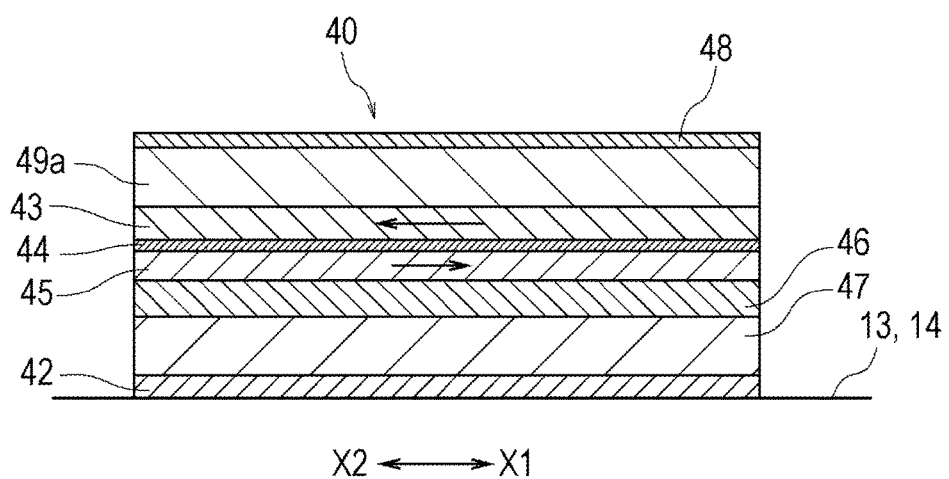

The magnetoresistive elements 40 (R1, R2, R3, and R4) are GMR elements (giant magnetoresistive elements) having the same structure. FIGS. 4A and 4B illustrate multilayer structures of the magnetoresistive elements 40.

The magnetoresistive element 40 illustrated in FIG. 4A is produced by forming a seed layer 42 made of Ni—Fe—Cr on the surface of the substrate 2 and then forming a fixed magnetic layer having a three-layer self-pinned structure on the seed layer 42 by successively forming a first ferromagnetic layer 43 made of Co—Fe, an intermediate layer 44 made of Ru, and a second ferromagnetic layer 45 made of Co—Fe.

Referring to FIG. 3A, when the magnetoresistive elements 40 (R1, R2, R3, R4) of the Z detection unit 10 are formed, the first ferromagnetic layer 43 is formed while a magnetic field Bx in an X-axis direction (X2 direction) is applied. Then, after the intermediate layer 44 is formed, the second ferromagnetic layer 45 is formed while a magnetic field Bx in an X-axis direction (X1 direction) opposite to that in the process of forming the first ferromagnetic layer 43 is applied.

When the thickness of the intermediate layer 44 made of Ru is appropriately set, the magnetization direction of the first ferromagnetic layer 43 is fixed to the X2 direction, and the magnetization direction of the second ferromagnetic layer 45 is fixed to the X1 direction. The magnetization direction of the second ferromagnetic layer 45 serves as the direction of fixed magnetization (P). In FIGS. 2A to 2C and FIGS. 3A and 3B, the directions of fixed magnetization (P) are shown by the arrows with solid lines.

The first ferromagnetic layer 43 may be formed as a high-coercive-force layer having a coercive force higher than that of the second ferromagnetic layer 45. In such a case, if the first ferromagnetic layer 43 is formed while the magnetic field Bx in the X2 direction is applied, even when the second ferromagnetic layer 45 is subsequently formed while no magnetic field is applied or while a magnetic field in any direction is applied, the magnetization direction of the first ferromagnetic layer 43 is fixed to the X2 direction and the magnetization direction of the second ferromagnetic layer 45 is fixed to the X1 direction.

After the fixed magnetic layer having the three-layer structure including the first ferromagnetic layer 43, the intermediate layer 44, and the second ferromagnetic layer 45 is formed, a nonmagnetic intermediate layer 46 made of Cu is formed on the second ferromagnetic layer 45, and a free magnetic layer 47 having a two-layer structure including a Co—Fe layer and a Ni—Fe layer is formed on the nonmagnetic intermediate layer 46. Then, the top surface is covered with a cap layer 48 made of Ta.

After the layers illustrated in FIG. 4A are formed, etching is performed so that only the magnetoresistive elements 40 (R1, R2, R3, and R4) remain and the multilayer body is removed in other regions.

The magnetoresistive element 40 illustrated in FIG. 4B is produced by forming a free magnetic layer 47 and a nonmagnetic intermediate layer 46 on a seed layer 42, and then forming a fixed magnetic layer having a three-layer self-pinned structure.

The fixed magnetic layer illustrated in FIG. 4B is formed by successively forming a second ferromagnetic layer 45, an intermediate layer 44, and a first ferromagnetic layer 43 on the nonmagnetic intermediate layer 46. When the first ferromagnetic layer 43 is formed in a magnetic field so that the magnetization direction thereof is set to the X2 direction, the magnetization direction of the second ferromagnetic layer 45 is fixed to the X1 direction due to cross-coupling (anti-parallel coupling) across the intermediate layer 44. Accordingly, the direction of fixed magnetization (P), which is the direction of a sensitivity axis, is set to the X1 direction.

For example, the second ferromagnetic layer 45 is formed while no magnetic field is applied or while a magnetic field in any direction is applied. Then, after the intermediate layer 44 is formed, the first ferromagnetic layer 43 is formed while a magnetic field in the X1 direction is applied. The first ferromagnetic layer 43 is formed as a high-coercive-force layer having a coercive force higher than that of the second ferromagnetic layer 45. When the first ferromagnetic layer 43 is gradually formed on the intermediate layer 44 while the second ferromagnetic layer 45 is magnetized in the X1 direction by a magnetic field, the first ferromagnetic layer 43 that is being formed is magnetized in the X2 direction due to cross-coupling (anti-parallel coupling) between the first ferromagnetic layer 43 and the second ferromagnetic layer 45. When the first ferromagnetic layer 43 is completely formed, the magnetization direction of the first ferromagnetic layer 43, which is a high-coercive-force layer, is fixed to the X2 direction, and the magnetization direction of the second ferromagnetic layer 45 is fixed to the X1 direction.

In the process of producing the magnetoresistive element 40 illustrated in FIG. 4B, an antiferromagnetic layer 49a made of, for example, an Ir—Mn alloy (iridium-manganese alloy) or a Pt—Mn alloy (platinum-manganese alloy) is formed on the first ferromagnetic layer 43, and is then annealed while no magnetic field is applied. Accordingly, the magnetization direction of the first ferromagnetic layer 43 is strongly fixed due to exchange coupling between the first ferromagnetic layer 43, which is magnetized in the X2 direction, and the antiferromagnetic layer 49a. As a result, the magnetization direction of the second ferromagnetic layer 45 is reliably fixed to the X1 direction.

As illustrated in FIGS. 2A and 3A, the magnetoresistive elements 40 included in the Z detection unit 10 are formed so that the directions of fixed magnetization (P) thereof are oriented in a thickness direction of the substrate 2 (depth direction of the Z detection recesses 11A and 11B) along the first inclined side surfaces 13 and the second inclined side surfaces 14. The layers of the magnetoresistive elements 40 are formed while the magnetic field Bx is applied so that, in the Z detection recess 11A, the direction of fixed magnetization (P) of the first magnetoresistive element 40 (R1) is fixed to a direction oriented upward from the bottom surface 12 toward the mounting surface 3, and the direction of fixed magnetization (P) of the second magnetoresistive element 40 (R2) is fixed to a direction oriented downward from the mounting surface 3 toward the bottom surface 12.

In the other Z detection recess 11B, the direction of fixed magnetization (P) of the fourth magnetoresistive element 40 (R4) is the same as that of the first magnetoresistive element 40 (R1), and the direction of fixed magnetization (P) of the third magnetoresistive element 40 (R3) is the same as that of the second magnetoresistive element 40 (R2).

Preferably, the free magnetic layer 47 of each magnetoresistive element 40 is put into a single magnetic domain state and has a uniform magnetization direction. The free magnetic layer 47 is magnetized in a uniform direction based on the shape anisotropy thereof or by being hard biased by an external magnet. In the Z detection unit 10 illustrated in FIG. 2A, the free magnetic layers 47 of all of the magnetoresistive elements 40 (R1, R2, R3, and R4) are magnetized so that the direction of magnetization (F) thereof is the Y2 direction, as shown by the arrows with broken lines.

When an external magnetic field in the Z1 direction or the Z2 direction is applied to the Z detection unit 10, the direction of magnetization (F) of each free magnetic layer 47 is changed toward the direction of the external magnetic field. When the direction of magnetization (F) of the free magnetic layer 47 and the direction of fixed magnetization (P) of the fixed magnetic layer are oriented toward the same side, the resistance is minimized. When the direction of magnetization (F) of the free magnetic layer 47 and the direction of fixed magnetization (P) of the fixed magnetic layer are oriented toward opposite sides, the resistance is maximized.

When an external magnetic field in the Z1 direction or the Z2 direction is applied to the Z detection unit 10, the resistances of the first magnetoresistive element 40 (R1) and the fourth magnetoresistive element 40 (R4) change in the same direction, and the resistances of the second magnetoresistive element 40 (R2) and the third magnetoresistive element 40 (R3) change in the same direction.

Figure 10A:
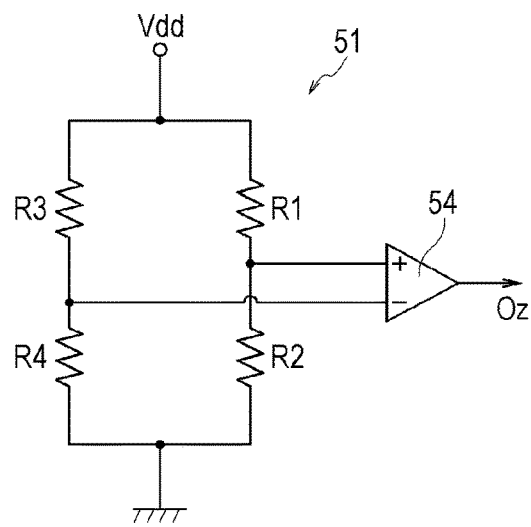
FIG. 10A is a circuit diagram of a bridge circuit for Z axis detection.

FIG. 10A illustrates a Z detection bridge circuit 51. In the bridge circuit 51, the first magnetoresistive element 40 (R1) and the second magnetoresistive element 40 (R2) are connected in series to form a first element line, and the third magnetoresistive element 40 (R3) and the fourth magnetoresistive element 40 (R4) are connected to form a second element line. The two element lines are connected in parallel. The first magnetoresistive element 40 (R1) and the third magnetoresistive element 40 (R3) are connected to a direct-current power supply, and the second magnetoresistive element 40 (R2) and the fourth magnetoresistive element 40 (R4) are grounded.

In the bridge circuit 51 illustrated in FIG. 10A, the second magnetoresistive element 40 (R2) and the third magnetoresistive element 40 (R3) may be switched.

As illustrated in FIG. 10A, a midpoint potential between the first magnetoresistive element 40 (R1) and the second magnetoresistive element 40 (R2) and a midpoint potential between the third magnetoresistive element 40 (R3) and the fourth magnetoresistive element 40 (R4) are applied to a differential amplifier 54, so that a Z-direction magnetic detection output Oz is obtained.

In the example illustrated in FIGS. 2A and 3A, when a magnetic field in the Z1 direction is applied to the Z detection unit 10 and the magnetization direction of the free magnetic layer 47 of each of the magnetoresistive elements 40 (R1, R2, R3, and R4) is changed toward the Z1 direction, the resistances of the magnetoresistive elements 40 (R1 and R4) decrease and the resistances of the magnetoresistive elements 40 (R2 and R3) increase. Accordingly, the magnetic detection output Oz increases. Conversely, when a magnetic field in the Z2 direction is applied and the magnetization direction of the free magnetic layer 47 of each of the magnetoresistive elements 40 (R1, R2, R3, and R4) is changed toward the Z2 direction, the magnetic detection output Oz decreases.

Referring to FIG. 3A, when the magnetoresistive elements 40 of the Z detection unit 10 are formed, the fixed magnetic layers are formed while the magnetic field Bx in an X-axis direction is applied so that the direction of fixed magnetization (P) of the fixed magnetic layers in the magnetoresistive elements 40 (R1 and R4) on the first inclined side surfaces 13 of the Z detection recesses 11A and 11B and that of the fixed magnetic layers in the magnetoresistive elements 40 (R2 and R3) on the second inclined side surfaces 14 of the Z detection recesses 11A and 11B are oriented toward opposite sides in the Z direction along the inclined side surfaces.

Therefore, when the bridge circuit 51 is formed by connecting the magnetoresistive elements 40 (R1 and R4) on the first inclined side surfaces 13 to the magnetoresistive elements 40 (R2 and R3) on the second inclined side surfaces 14 in series, a magnetic field in the Z direction can be accurately detected.

As illustrated in FIGS. 2B and 3B, in the X detection unit 20, a fifth magnetoresistive element 40 (R5) is provided on the first inclined side surface 23 of the X detection recess 21A, and a sixth magnetoresistive element 40 (R6) is provided on the second inclined side surface 24 of the X detection recess 21A. An eighth magnetoresistive element 40 (R8) is provided on the first inclined side surface 23 of the X detection recess 21B, and a seventh magnetoresistive element 40 (R7) is provided on the second inclined side surface 24 of the X detection recess 21B.

The layer structure of each of the magnetoresistive elements 40 (R5, R6, R7, and R8) is the same as that illustrated in FIGS. 4A and 4B. Referring to FIG. 3B, when the magnetoresistive elements 40 of the X detection unit 20 are formed, the first ferromagnetic layer 43 is formed while a magnetic field Bz in the Z2 direction is applied so that the magnetization direction thereof is fixed to a direction oriented along the Z2 direction, and the second ferromagnetic layer 45 is formed while a magnetic field Bz in the Z1 direction is applied so that the magnetization direction thereof is fixed to a direction oriented upward. Therefore, as shown by the arrows with solid lines, the directions of fixed magnetization (P) of the fixed magnetic layers in the magnetoresistive elements 40 (R5, R6, R7, and R8) are fixed to directions oriented upward along the inclined side surfaces 23 and 24 at an angle with respect to the thickness direction of the substrate 2.

In both of the X detection recesses 21A and 21B, the direction of fixed magnetization (P) of the fixed magnetic layers in the magnetoresistive elements 40 (R5 and R8) on the first inclined side surfaces 23 and that of the fixed magnetic layers in the magnetoresistive elements 40 (R6 and R7) on the second inclined side surfaces 24 are oriented toward opposite sides in the X direction.

Therefore, when an external magnetic field in the X direction is applied, the direction in which the resistances of the fifth magnetoresistive element 40 (R5) and the eighth magnetoresistive element 40 (R8) change is opposite to the direction in which the resistances of the sixth magnetoresistive element 40 (R6) and the seventh magnetoresistive element 40 (R7) change.

Figure 10B:
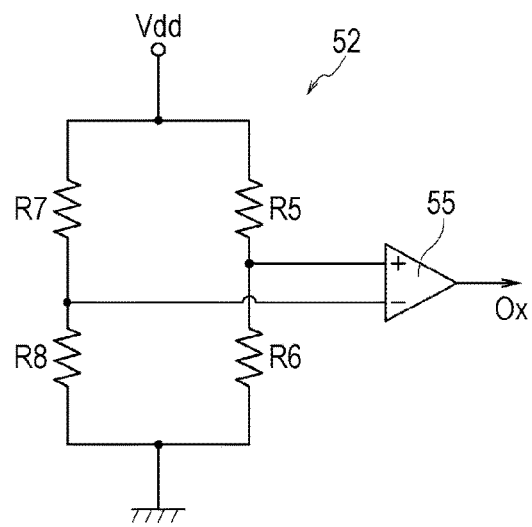
FIG. 10B is a circuit diagram of a bridge circuit for X axis detection.

As illustrated in FIG. 10B, in the X detection unit 20, the magnetoresistive elements 40 (R5, R6, R7, and R8) form an X detection bridge circuit 52. When an external magnetic field in the X1 direction is applied to the X detection unit 20, a magnetic detection output Ox from a differential amplifier 55 increases. When an external magnetic field in the X2 direction is applied, the magnetic detection output Ox from the differential amplifier 55 decreases.

In the Y detection unit 30 illustrated in FIG. 2C, a ninth magnetoresistive element 40 (R9) is provided on the first inclined side surface 33 of the Y detection recess 31A, and a tenth magnetoresistive element 40 (R10) is provided on the second inclined side surface 34 of the Y detection recess 31A. A twelfth magnetoresistive element 40 (R12) is provided on the first inclined side surface 33 of the Y detection recess 31B, and an eleventh magnetoresistive element 40 (R11) is provided on the second inclined side surface 34 of the Y detection recess 31B.

The layer structure of each of the magnetoresistive elements 40 (R9, R10, R11, and R12) is the same as that illustrated in FIGS. 4A and 4B. Similar to the X detection unit 20, when the magnetoresistive elements 40 of the Y detection unit 30 are formed, the fixed magnetic layers are formed while the magnetic field Bz is applied so that, as shown by the arrows with solid lines, the directions of fixed magnetization (P) of the fixed magnetic layers in the magnetoresistive elements 40 (R9, R10, R11, and R12) are fixed to directions oriented upward along the inclined side surfaces 33 and 34 at an angle with respect to the thickness direction of the substrate 2.

In both of the Y detection recesses 31A and 31B, the direction of fixed magnetization (P) of the fixed magnetic layers in the magnetoresistive elements 40 (R9 and R12) on the first inclined side surfaces 33 and that of the fixed magnetic layers in the magnetoresistive elements 40 (R10 and R11) on the second inclined side surfaces 34 are oriented toward opposite sides in the Y direction.

Therefore, when an external magnetic field in the Y direction is applied, the direction in which the resistances of the ninth magnetoresistive element 40 (R9) and the twelfth magnetoresistive element 40 (R12) change is opposite to the direction in which the resistances of the tenth magnetoresistive element 40 (R10) and the eleventh magnetoresistive element 40 (R11) change.

Figure 10C:
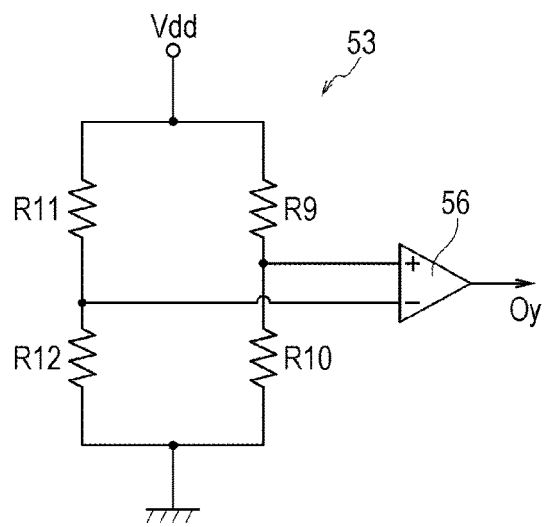
FIG. 10C is a circuit diagram of a bridge circuit for Y axis detection.

As illustrated in FIG. 10C, in the Y detection unit 30, the magnetoresistive elements 40 (R9, R10, R11, and R12) form a Y detection bridge circuit 53. When an external magnetic field in the Y1 direction is applied to the Y detection unit 30, a magnetic detection output Oy from a differential amplifier 56 increases. When an external magnetic field in the Y2 direction is applied, the magnetic detection output Oy from the differential amplifier 56 decreases.

In the magnetoresistive elements 40 (R5, R6, R7, and R8) of the X detection unit 20 and the magnetoresistive elements 40 (R9, R10, R11, and R12) of the Y detection unit 30, the free magnetic layers 47 are magnetized in the Y2 direction and the X1 direction, respectively, as shown by the arrows with broken lines in FIGS. 2B and 2C, based on the shape anisotropy thereof or by, for example, hard biasing.

In the magnetic detection device 1 illustrated in FIG. 1, the Z detection unit 10, the X detection units 20, and the Y detection units 30 are formed on a single substrate 2. Therefore, magnetic fields in the Z, X, and Y directions and variations in the intensities thereof can be detected by using a single substrate 2.

The Z detection recesses 11A and 11B of the Z detection unit 10, the X detection recesses 21A and 21B of each X detection unit 20, and the Y detection recesses 31A and 31B of each Y detection unit 30 can be formed simultaneously by etching.

When the magnetoresistive elements 40 of the Z detection unit 10 are formed, the fixed magnetic layers are formed while the magnetic field Bx is applied. When the magnetoresistive elements 40 of the X detection units 20 and the Y detection units 30 are formed, the fixed magnetic layers of the detection units 20 and 30 can be formed simultaneously while the magnetic field Bz is applied. Thus, in each of the X detection units 20 and the Y detection units 30, the directions of fixed magnetization (P) of the fixed magnetic layers can be set to directions oriented in the thickness direction of the substrate along the inclined side surfaces.

In the first embodiment, the Z detection unit 10, the X detection units 20, and the Y detection units 30 can be formed even when magnetic fields are applied only in two directions when the fixed magnetic layers of the magnetoresistive elements 40 are formed.

FIGS. 5A to 5C illustrate a magnetic detection device 101 according to a second embodiment of the present invention.

Similar to the magnetic detection device 1 according to the first embodiment illustrated in FIGS. 2A to 2C, in this magnetic detection device 101, a Z detection unit 10 includes Z detection recesses 11A and 11B, each X detection unit 20 includes X detection recesses 21A and 21B, and each Y detection unit 30 includes Y detection recesses 31A and 31B.

Figure 6A:
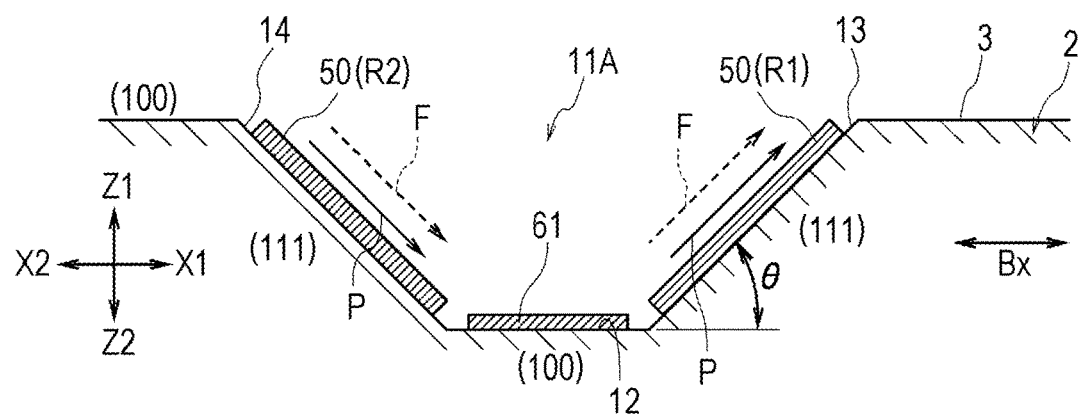
FIG. 6A is a sectional view of the Z detection unit illustrated in FIG. 5A taken along line VIA-VIA.

As illustrated in FIGS. 5A and 6A, a first magnetoresistive element 50 (R1) is formed on a first inclined side surface 13 of the Z detection recess 11A, and a second magnetoresistive element 50 (R2) is formed on a second inclined side surface 14 of the Z detection recess 11A. As illustrated in FIG. 5A, a fourth magnetoresistive element 50 (R4) is formed on a first inclined side surface 13 of the Z detection recess 11B, and a third magnetoresistive element 50 (R3) is formed on a second inclined side surface 14 of the Z detection recess 11B.

Figure 6B:
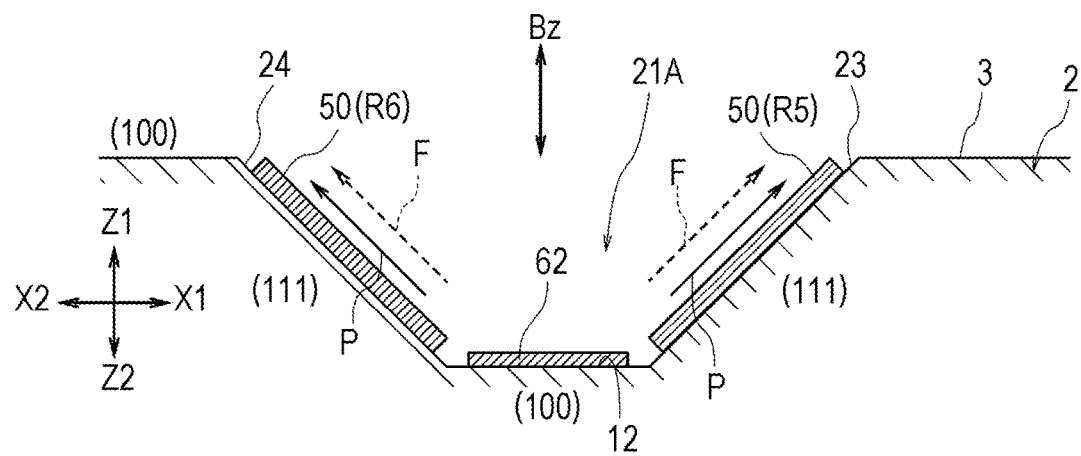
FIG. 6B is a sectional view of the X detection unit illustrated in FIG. 5B taken along line VIB-VIB.

As illustrated in FIGS. 5B and 6B, a fifth magnetoresistive element 50 (R5) is formed on a first inclined side surface 23 of the X detection recess 21A, and a sixth magnetoresistive element 50 (R6) is formed on a second inclined side surface 24 of the X detection recess 21A. An eighth magnetoresistive element 50 (R8) is formed on a first inclined side surface 23 of the X detection recess 21B, and a seventh magnetoresistive element 50 (R7) is formed on a second inclined side surface 24 of the X detection recess 21B.

As illustrated in FIG. 5C, a ninth magnetoresistive element 50 (R9) is formed on a first inclined side surface 33 of the Y detection recess 31A, and a tenth magnetoresistive element 50 (R10) is formed on a second inclined side surface 34 of the Y detection recess 31A. A twelfth magnetoresistive element 50 (R12) is formed on a first inclined side surface 33 of the Y detection recess 31B, and an eleventh magnetoresistive element 50 (R11) is formed on a second inclined side surface 34 of the Y detection recess 31B.

Figure 9:
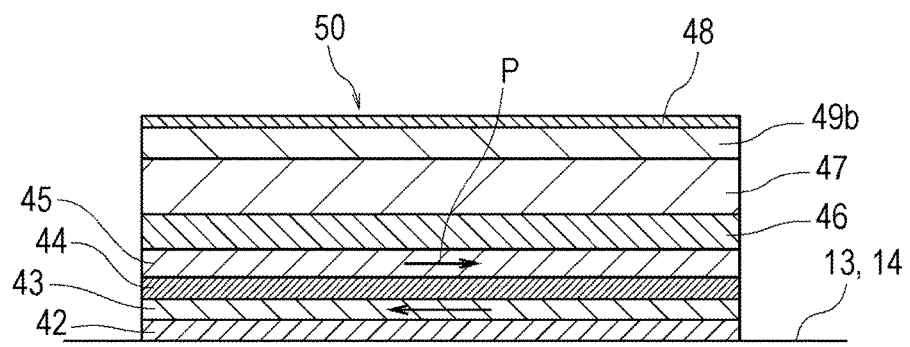
FIG. 9 is an enlarged sectional view illustrating a layer structure of magnetoresistive elements included in the magnetic detection device illustrated in FIGS. 5A to 5C and FIGS. 6A and 6B.

As illustrated in FIG. 9, similar to the magnetoresistive element 40 illustrated in FIG. 4A, in each of the magnetoresistive elements 50 according to the second embodiment, a ferromagnetic layer 43 made of Co—Fe, an intermediate layer 44 made of Ru, and a second ferromagnetic layer 45 made of Co—Fe are formed on a seed layer 42 to form a fixed magnetic layer having a three-layer self-pinned structure.

As illustrated in FIG. 6A, in the Z detection unit 10, the fixed magnetic layers having the three-layer structure are formed while the magnetic field Bx is applied so that the directions of fixed magnetization (P) of the fixed magnetic layers in the magnetoresistive elements 50 (R1, R2, R3, and R4) are fixed to the directions shown by the arrows with solid lines. As illustrated in FIG. 6B, in the X detection unit 20, the fixed magnetic layers having the three-layer structure are formed while the magnetic field Bz is applied so that the directions of fixed magnetization (P) of the fixed magnetic layers in the magnetoresistive elements 50 (R5, R6, R7, and R8) are fixed to the directions shown by the arrows with solid lines. Similarly, in the Y detection unit 30, the fixed magnetic layers are formed while the magnetic field Bz is applied so that the directions of fixed magnetization (P) of the fixed magnetic layers in the magnetoresistive elements 50 (R9, R10, R11, and R12) are fixed to the directions shown by the arrows with solid lines.

As illustrated in FIG. 9, after the direction of fixed magnetization (P) of the fixed magnetic layer of each magnetoresistive element 50 is fixed, a nonmagnetic intermediate layer 46 is formed on the fixed magnetic layer, and a portion of the free magnetic layer 47 are formed on the nonmagnetic intermediate layer 46.

After that, an upper portion of the free magnetic layer 47 is additionally formed, and an upper antiferromagnetic layer 49b made of Ir—Mn is formed on the upper portion of the free magnetic layer 47 while a magnetic field is applied. Since the magnetic field is applied, the free magnetic layer 47 is put into a single magnetic domain state and magnetized in a uniform direction due to exchange coupling between the upper antiferromagnetic layer 49b and the free magnetic layer 47.

In the Z detection unit 10, the upper antiferromagnetic layer 49b is formed while a magnetic field in the X1 direction is applied so that, as shown by the arrows with broken lines in FIGS. 5A and 6A, the direction of magnetization (F) of the free magnetic layer 47 is the same as the direction of fixed magnetization (P). In the X detection unit 20 and the Y detection unit 30, the upper antiferromagnetic layer 49b is formed while a magnetic field in the Z1 direction is applied so that, as shown by the arrows with broken lines, the direction of magnetization (F) of each free magnetic layer 47 is the same as the direction of fixed magnetization (P).

The structures of bridge circuits obtained by connecting the magnetoresistive elements in the magnetic detection device 101 according to the second embodiment are the same as those illustrated in FIGS. 10A, 10B, and 10C.

As illustrated in FIGS. 5A to 5C and FIGS. 6A and 6B, in each of the magnetoresistive elements 50 (R1 to R12) included in the magnetic detection device 101 according to the second embodiment, the direction of fixed magnetization (P) of the fixed magnetic layer is the same as the direction of magnetization (F) of the free magnetic layer 47 when no external magnetic field is applied. Therefore, the resistance of the magnetoresistive element 50 is at a minimum. When the intensity of an external magnetic field in a direction opposite to the direction of magnetization (F) of the free magnetic layer 47 is gradually increased, the direction of magnetization (F) of the free magnetic layer 47 is reversed, and the resistance of the magnetoresistive element 50 is maximized. Thus, the magnetic detection outputs Oz, Ox, and Oy are changed.

In the Z detection unit 10, the directions of magnetization (F) of the free magnetic layers 47 may be opposite to the directions shown by the arrows with broken line in FIG. 6A. Similarly, also in the X detection unit 20 and the Y detection unit 30, the directions of magnetization (F) of the free magnetic layers 47 may be opposite to the directions shown by the arrow with broken line in FIG. 6B.

As illustrated in FIG. 5A, in the magnetic detection device 101 according to the second embodiment, a shield layer 61 composed of a soft magnetic material layer made of NI—Fe, for example, is formed on a bottom surface 12 of each of the Z detection recesses 11A and 11B of the Z detection unit 10. Preferably, a shield layer is additionally formed on a mounting surface 3 of the substrate 2 so as to surround each of the Z detection recesses 11A and 11B. When the shield layer 61 is provided, a magnetic field in a direction other than the Z direction, which is the sensitivity direction, can be absorbed and superposition of noise on the magnetic detection output Oz due to a disturbance magnetic field can be prevented.

Similarly, in the X detection unit 20, a shield layer 62 is formed on a bottom surface 22 of each of the X detection recesses 21A and 21B, and a shield layer 63 is formed on the mounting surface 3 in the region between the X detection recesses 21A and 21B. The shield layers 62 and 63 have an elongated shape that extends in a direction perpendicular to the directions of fixed magnetization (P) of the fixed magnetic layers in the magnetoresistive elements 50 (R5, R6, R7, and R8). Accordingly, a disturbance magnetic field in a direction other than the X direction, which is the sensitivity direction, can be absorbed.

In the Y detection unit 30, a shield layer 64 is formed on a bottom surface 32 of each of the Y detection recesses 31A and 31B, and a shield layer 65 is formed on the mounting surface 3 in the region between the Y detection recesses 31A and 31B. The shield layers 64 and 65 have an elongated shape that extends in a direction perpendicular to the directions of fixed magnetization (P) of the fixed magnetic layers in the magnetoresistive elements 50 (R9, R10, R11, and R12). Accordingly, a disturbance magnetic field in a direction other than the Y direction, which is the sensitivity direction, can be absorbed.

By placing a shield layer on the bottom surface of each detection recess, the required shield layers can be arranged in a space-saving manner.

FIGS. 7A to 7C illustrates a magnetic detection device 1a according to a modification of the first embodiment. A Z detection unit 10a illustrated in FIG. 7A is a modification of the Z detection unit 10 included in the magnetic detection device 1 illustrated in FIGS. 2A to 2C. The structures of an X detection unit 20 illustrated in FIG. 7B and a Y detection unit 30 illustrated in FIG. 7C are the same as those illustrated in FIGS. 2B and 2C.

In the Z detection unit 10 illustrated in FIG. 2A, the Z detection recesses 11A and 11B have a square shape that differs from the elongated rectangular shape of the X detection recesses 21A and 21B and the Y detection recesses 31A and 31B. The dimensions of the magnetoresistive elements 40 provided in the Z detection recesses 11A and 11B illustrated in FIG. 2A along the substrate surface is less than the dimensions of the magnetoresistive elements 40 of the X detection unit 20 illustrated in FIG. 2B and the Y detection unit 30 illustrated in FIG. 2C along the substrate surface.

In contrast, in the Z detection unit 10a illustrated in FIG. 7A, the shape and dimensions of the Z detection recesses 11A and 11B are the same as the shape and dimensions of the X detection recesses 21A and 21B and the Y detection recesses 31A and 31B. In addition, the shape and dimensions of the magnetoresistive elements 40 (R1, R2, R3, and R4) provided in the Z detection recesses 11A and 11B are the same as those of the magnetoresistive elements 40 (R5, R6, R7, and R8) provided in the X detection recesses 21A and 21B and the magnetoresistive elements 40 (R9, R10, R11, and R12) provided in the Y detection recesses 31A and 31B.

The Z detection recesses 11A and 11B in the Z detection unit 10a illustrated in FIG. 7A can be formed so that the longitudinal direction thereof is the same as that of the X detection recesses 21A and 21B. Alternatively, the Z detection recesses 11A and 11B can be formed so that the longitudinal direction thereof is the same as that of the Y detection recesses 31A and 31B. In addition, all of the magnetoresistive elements 40 can be formed in the same pattern and size. In addition, the area of the magnetoresistive elements 40 (R1, R2, R3, and R4) included in the Z detection unit 10a illustrated in FIG. 7A is greater than that of the magnetoresistive elements 40 (R1, R2, R3, and R4) included in the Z detection unit 10 illustrated in FIG. 2A. Therefore, the rate of change of the resistances of the magnetoresistive elements 40 (R1, R2, R3, and R4) can be increased, and the sensitivity of the Z detection unit can be increased accordingly.

The shape and size of the Z detection unit 10, 10a according to the present invention are not limited to those in the above-described embodiments. For example, when the detection units are arranged on the same substrate, the Z detection unit 10, 10a may be formed so that the area thereof is greater than that of the X detection unit 20 or the Y detection unit 30.

FIGS. 8A to 8C illustrates a magnetic detection device 201 according to a third embodiment of the present invention.

A Z detection unit 10b illustrated in FIG. 8A includes Z detection recesses 11A and 11B having the same shape and dimensions as those of the Z detection recesses 11A and 11B included in the Z detection unit 10 illustrated in FIG. 2A. In the Z detection unit 10b illustrated in FIG. 8A, the direction of fixed magnetization (P) of a first magnetoresistive element 40 (R1) provided on a first inclined side surface 13 of the Z detection recess 11A and that of a fourth magnetoresistive element 40 (R4) provided on a second inclined side surface 14 of the Z detection recess 11A are both oriented in the Z1 direction. In addition, the direction of fixed magnetization (P) of a second magnetoresistive element 40 (R2) provided on a first inclined side surface 13 of the Z detection recess 11B and a third magnetoresistive element 40 (R3) provided on a second inclined side surface 14 of the Z detection recess 11B are both oriented in the Z2 direction.

In the Z detection unit 10b illustrated in FIG. 8A, the magnetoresistive elements 40 (R1, R2, R3, and R4) form a bridge circuit 51 that is the same as that illustrated in the circuit diagram of FIG. 10A. Here, the first magnetoresistive element 40 (R1) on the first inclined side surface 13 of the Z detection recess 11A and the second magnetoresistive element 40 (R2) on the first inclined side surface 13 of the Z detection recess 11B are connected in series to form a first element line. The third magnetoresistive element 40 (R3) on the second inclined side surface 14 of the Z detection recess 11B and the fourth magnetoresistive element 40 (R4) on the second inclined side surface 14 of the Z detection recess 11A are connected in series to form a second element line. The first element line and the second element line are connected in parallel to form the bridge circuit.

The Z detection recesses 11A and 11B are formed in the same etching process. Therefore, the first inclined side surface 13 of the Z detection recess 11A and the first inclined side surface 13 of the Z detection recess 11B, which are formed along the same crystal plane, are easily formed to have the same angle. Also, the second inclined side surface 14 of the Z detection recess 11A and the second inclined side surface 14 of the Z detection recess 11B, which are formed along the same crystal plane, are easily formed to have the same angle. Accordingly, when the first magnetoresistive element 40 (R1) and the second magnetoresistive element 40 (R2) provided on the first inclined side surfaces 13, which can be easily formed to have the same angle, are connected in series to form the first element line and when the midpoint potential of the first element line is obtained, differences in midpoint potential of the first element line between products can be easily reduced. Similarly, when the third magnetoresistive element 40 (R3) and the fourth magnetoresistive element 40 (R4) provided on the second inclined side surfaces 14, which can be easily formed to have the same angle, are connected in series to form the second element line and when the midpoint potential of the second element line is obtained, differences in midpoint potential of the second element line between products can be easily reduced.

In an X detection unit 20b illustrated in FIG. 8B, the directions of fixed magnetization (P) of a fifth magnetoresistive element 40 (R5) and an eighth magnetoresistive element 40 (R8) provided on inclined side surfaces of an X detection recess 21A are both oriented in the X1 direction. The directions of fixed magnetization (P) of a sixth magnetoresistive element 40 (R6) and a seventh magnetoresistive element 40 (R7) provided on inclined side surfaces of an X detection recess 21B are both oriented the X2 direction. Thus, the directions of fixed magnetization (P) of the magnetoresistive elements 40 in the X detection recess 21A are opposite to those of the magnetoresistive elements 40 in the X detection recess 21B in the X direction.

Also in the X detection unit 20b, the fifth magnetoresistive element 40 (R5) and the sixth magnetoresistive element 40 (R6) provided on the first inclined side surfaces 23, which can be easily formed to have the same angle, of the X detection recesses 21A and 21B are connected in series to form a first element line. The seventh magnetoresistive element 40 (R7) and the eighth magnetoresistive element 40 (R8) provided on the second inclined side surfaces 24 of the X detection recesses 21A and 21B, which can be easily formed to have the same angle, are connected in series to form a second element line. Since the magnetoresistive elements provided on the inclined side surfaces that can be easily formed to have the same angle are connected in series, differences in midpoint potentials of the first element line and the second element line can be reduced.

The Y detection unit 30b has a structure obtained by rotating the X detection unit 20b ninety degrees along the substrate surface. Accordingly, the Y detection unit 30b has an effect similar to that of the X detection unit 20b.

In each of the above-described embodiments, the fixed magnetic layer of each magnetoresistive element has a self-pinned structure, and is formed while a magnetic field is applied. Accordingly, it is not necessary to perform annealing in a magnetic field. Therefore, the magnetoresistive elements may be formed on the inclined side surfaces of the detection recesses in the same substrate so as to have any combination of directions of fixed magnetization (P).

In each of the above-described embodiments, the fixed magnetic layers of the magnetoresistive elements 40 and 50 each have a so-called self-pinned structure in which the first ferromagnetic layer 43 and the second ferromagnetic layer 45 are formed while the magnetic fields Bx and Bz are applied. However, the direction of fixed magnetization (P) of each fixed magnetic layer may instead be fixed by exchange coupling by forming an antiferromagnetic layer made of Ir—Mn or Pt—Mn on a ferromagnetic layer that serves as the fixed magnetic layer and performing annealing in a magnetic field. In this case, annealing is performed while the magnetic field Bx is applied for the Z detection unit 10, and while the magnetic field Bz is applied for the X detection unit 20 and the Y detection unit 30.

What is claimed is:

1. A magnetic detection device comprising:
    a substrate having a mounting surface and a thickness, the substrate having a plurality of recesses, the recesses having inclined side surfaces; a Z direction being in the thickness direction of the substrate and perpendicular to the mounting surface of the substrate,
    magnetoresistive elements provided on the inclined side surfaces of the recesses, including Z detection recesses disposed at least at two locations, each Z detection recess including a first inclined side surface and a second inclined side surface opposing each other with a distance therebetween gradually increasing toward the mounting substrate surface, the first inclined side surface and the second inclined side surface having the magnetoresistive elements provided thereon,
    the magnetoresistive elements each including a fixed magnetic layer, a free magnetic layer, and a nonmagnetic intermediate layer between the fixed magnetic layer and the free magnetic layer, and a direction of fixed magnetization of the fixed magnetic layer of each magnetoresistive element is oriented along a corresponding one of the inclined side surfaces obliquely to the Z direction, and
    a bridge circuit comprising two element lines connected in parallel, each element line comprising two of the magnetoresistive elements connected in series, wherein the connected magnetoresistive elements have directions of fixed magnetization oriented toward opposite sides in the thickness direction of the substrate, and
    wherein the bridge circuit detects a magnetic field in the Z direction; and,
    wherein the Z detection recesses include a Z detection recess in which the directions of fixed magnetization of the magnetoresistive elements provided on the first inclined side surface and the second inclined side surface are both oriented downward in the thickness direction of the substrate and a Z detection recess in which the directions of fixed magnetization of the magnetoresistive elements provided on the first inclined side surface and the second inclined side surface are both oriented upward in the thickness direction of the substrate,
    wherein the magnetoresistive elements provided on the first inclined side surfaces of different ones of the Z detection recesses and having the directions of fixed magnetization oriented toward the opposite sides are connected in series to form a first element line,
    wherein the magnetoresistive elements provided on the second inclined side surfaces of different ones of the Z detection recesses and having the directions of fixed magnetization oriented toward the opposite sides are connected in series to form a second element line, and
    wherein the first element line and the second element line are connected in parallel to form the bridge circuit.

2. The magnetic detection device according to claim 1, wherein, in each of the Z detection recesses, the direction of fixed magnetization of the magnetoresistive element provided on the first inclined side surface and the direction of fixed magnetization of the magnetoresistive element provided on the second inclined side surface are oriented toward the opposite sides in the thickness direction of the substrate.

3. The magnetic detection device according to claim 1, wherein horizontal detection recesses are disposed at least at two locations on the substrate in addition to the Z detection recesses, each horizontal detection recess including a first inclined side surface and a second inclined side surface opposing each other with a distance therebetween gradually increasing toward the substrate surface, the first inclined side surface and the second inclined side surface having the magnetoresistive elements provided thereon,
    wherein a direction of fixed magnetization of the fixed magnetic layer of each magnetoresistive element is oriented along a corresponding one of the inclined side surfaces obliquely to the thickness direction of the substrate,
    wherein a bridge circuit is formed by connecting two element lines in parallel, each element line being formed by connecting in series two of the magnetoresistive elements provided in the horizontal detection recesses and having the directions of fixed magnetization oriented toward opposite sides along the substrate surface, and
    wherein the bridge circuit detects a magnetic field in a direction parallel to the substrate surface.

4. The magnetic detection device according to claim 3, wherein, in each of the horizontal detection recesses, the direction of fixed magnetization of the magnetoresistive element provided on the first inclined side surface and the direction of fixed magnetization of the magnetoresistive element provided on the second inclined side surface are oriented toward the opposite sides along substrate surface.

5. The magnetic detection device according to claim 3, wherein, in each of the horizontal detection recesses, the direction of fixed magnetization of the magnetoresistive element provided on the first inclined side surface and the direction of fixed magnetization of the magnetoresistive element provided on the second inclined side surface are oriented toward the same side along the substrate surface,
    wherein the directions of fixed magnetization of the magnetoresistive elements provided in different ones of the horizontal detection recesses are oriented toward the opposite sides along the substrate surface,
    wherein the magnetoresistive elements provided on the first inclined side surfaces of different ones of the horizontal detection recesses and having the directions of fixed magnetization oriented toward the opposite sides are connected in series to form a first element line,
    wherein the magnetoresistive elements provided on the second inclined side surfaces of different ones of the horizontal detection recesses and having the directions of fixed magnetization oriented toward the opposite sides are connected in series to form a second element line, and
    wherein the first element line and the second element line are connected in parallel to form the bridge circuit.

6. The magnetic detection device according to claim 3, wherein the horizontal detection recesses include X detection recesses disposed at least at two locations on the substrate to detect a magnetic field in an X direction and Y detection recesses disposed at least at two locations on the substrate to detect a magnetic field in a Y direction, the X and Y directions being perpendicular to each other.

7. The magnetic detection device according to claim 3, wherein a length of the magnetoresistive elements provided in the Z detection recesses in a direction along the substrate surface is shorter than a length of the magnetoresistive elements provided in the horizontal detection recesses in the direction along the substrate surface.

8. The magnetic detection device according to claim 3, wherein a length of the magnetoresistive elements provided in the Z detection recesses in a direction along the substrate surface is equal to a length of the magnetoresistive elements provided in the horizontal detection recesses in the direction along the substrate surface.

9. The magnetic detection device according to claim 1, wherein a magnetic shield layer comprised of a soft magnetic material is provided on at least one of the substrate surface and a bottom surface of each recess.

* * * * *